(12) United States Patent
Chen et al.

(10) Patent No.: US 6,938,681 B2
(45) Date of Patent: Sep. 6, 2005

(54) HEAT PIPE TYPE HEAT DISSIPATION DEVICE

(75) Inventors: Chun-Chi Chen, Tu-chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/901,716

(22) Filed: Jul. 28, 2004

(65) Prior Publication Data

US 2005/0056400 A1 Mar. 17, 2005

(30) Foreign Application Priority Data

Sep. 12, 2003 (TW) ..................................... 92216482 U

(51) Int. Cl.⁷ .............................................. F28D 15/00
(52) U.S. Cl. ........................... 165/104.33; 165/104.21; 165/80.4; 165/104.26; 361/697; 361/700; 257/715
(58) Field of Search ....................... 165/104.21, 104.26, 165/104.33, 80.4, 80.3, 185; 361/697, 700; 257/714–716; 174/15.2

(56) References Cited

U.S. PATENT DOCUMENTS

| | | | | |
|---|---|---|---|---|
| 4,204,246 A | | 5/1980 | Arii et al. | |
| 5,651,414 A | * | 7/1997 | Suzuki et al. | 165/104.14 |
| 5,924,479 A | * | 7/1999 | Egbert | 165/104.14 |
| 5,925,929 A | | 7/1999 | Kuwahara et al. | |
| 6,084,772 A | * | 7/2000 | Pell et al. | 361/699 |
| 6,167,619 B1 | * | 1/2001 | Beagle | 29/890.043 |
| 6,382,307 B1 | | 5/2002 | Wang et al. | |
| 6,404,632 B1 | * | 6/2002 | Forkas | 361/703 |
| 6,435,266 B1 | | 8/2002 | Wu | |
| 6,542,364 B2 | * | 4/2003 | Lai et al. | 361/697 |
| 6,625,021 B1 | * | 9/2003 | Lofland et al. | 361/697 |
| 6,651,733 B1 | * | 11/2003 | Horng et al. | 165/80.3 |
| 6,745,824 B2 | * | 6/2004 | Lee et al. | 165/104.14 |
| 6,749,011 B2 | * | 6/2004 | Horng et al. | 165/80.3 |
| 6,779,595 B1 | * | 8/2004 | Chiang | 165/104.33 |
| 6,785,140 B2 | * | 8/2004 | Artman et al. | 361/709 |
| 2005/0073811 A1 | * | 4/2005 | Wang et al. | 361/688 |

* cited by examiner

Primary Examiner—Terrell McKinnon
(74) Attorney, Agent, or Firm—Wei Te Chung

(57) ABSTRACT

A heat dissipation device includes a base (10), a post (20), a plurality of fins (50), a pair of heat pipes (30) and a pair of plates (40). The base is for contacting an electronic component. Each fin defines an aperture (52) therein. When the fins are parallelly stacked upon the base, the apertures cooperatively define a channel. The post is extended perpendicularly from the base and received in the channel. The post defines a pair of through holes (21) along a length direction thereof. The plates are located at opposite peripheries of the stacked fins and parallel to the post. Each plate defines an engaging hole (41) therein. Each heat pipe is substantially inverted U-shaped and includes parallel first and second section (32, 34) respectively soldered into a corresponding through hole of the post and the engaging hole of a corresponding plate.

15 Claims, 3 Drawing Sheets

US 6,938,681 B2

HEAT PIPE TYPE HEAT DISSIPATION DEVICE

BACKGROUND OF THE INVENTION

1. Field of the Invention

The present invention relates to heat dissipation devices for removing heat from electronic components, and more particularly to a heat dissipation device combining heat sink and heat pipes together.

2. Description of Related Art

Conventional heat dissipation devices used for removing heat from electronic components are mostly formed by extrusion of metallic material. Such kind of heat dissipation device commonly comprises a base, and a plurality of fins integrally extending from the base. The fins are relatively thick in comparison with distances defined between each two adjacent fins, due to inherent limitations in extrusion technology. This restricts the number of the fins that can be formed, and a total heat dissipation area that can be provided by the fins. Furthermore, a height of the fins is limited to about 13 times the distance between each two adjacent fins, also due to inherent limitations in extrusion technology.

In order to keep pace with these developments in electronics technology, assembled heat dissipation devices have been gaining in popularity. For example, China Patent No. 2462641Y provides an assembled heat dissipation device having a plurality of uniformly dimensioned individual plate fins evenly stacked together. This heat dissipation device can provide a large total heat dissipation area. However, the fins are connected together only by the attachment of the tabs of each fin in the indents of the adjacent fin. The fins are prone to be disengaged from each other when the heat dissipation device is subjected to shock or vibration during transportation or in operation. Part of or even the entire stack of fins may collapse.

With the continuing boom in electronics technology, numerous modem electronic components such as central processing units (CPUs) of computers can operate at very high speeds and thus generate large amounts of heat. The heat must be efficiently removed from the CPU; otherwise, abnormal operation or damage may result. The conventional heat removal way merely by conduct of heat is increasingly no longer able to adequately remove heat from these contemporary electronic components.

Meanwhile, heat pipes have been generally applied to enhance heat removal efficiency. FIG. 3 shows a heat dissipation device including a plurality of small heat pipes perpendicularly inserted into a base and a plurality of spaced fins individually perpendicularly engaged with the heat pipes. However, the fins must be punctured to define a plurality of small through holes. The heat pipes are soldered to the spaced individual fins in the through holes respectively. This is unduly inconvenient due to the dimensions of the through holes. Furthermore, the engagement of the heat pipes with the base is limited by the thickness of the base. The total contacting area between the heat pipes and the fins is limited by the dimension of the heat pipes. Though the heat pipes inherently have a great heat-transfer capability, the heat dissipation device is not yet enhanced to remove heat from the CPU.

SUMMARY OF THE INVENTION

Accordingly, an object of the present invention is to provide a heat dissipation device in which heat sink and heat pipes are combined to optimize the heat removal capacity of the heat dissipation device.

In order to achieve the object set out above, a heat dissipation device in accordance with a preferred embodiment of the present invention comprises a base, a post, a plurality of fins, a pair of heat pipes and a pair of plates. The base is for contacting an electronic component. Each fin defines an aperture therein. When the fins are parallelly stacked upon the base, the apertures cooperatively define a channel. The post is extended perpendicularly from the base and received in the channel. The post defines a pair of through holes along a length direction thereof. The plates are located at opposite peripheries of the stacked fins and parallel to the post. Each plate defines an engaging hole therein. Each heat pipe is substantially inverted U-shaped and includes parallel first and second section respectively soldered into a corresponding through hole of the post and the engaging hole of a corresponding plate.

Other objects, advantages and novel features of the present invention will become more apparent from the following detailed description when taken in conjunction with the accompanying drawings, in which:

DETAILED DESCRIPTION OF THE INVENTION

Figure 1:
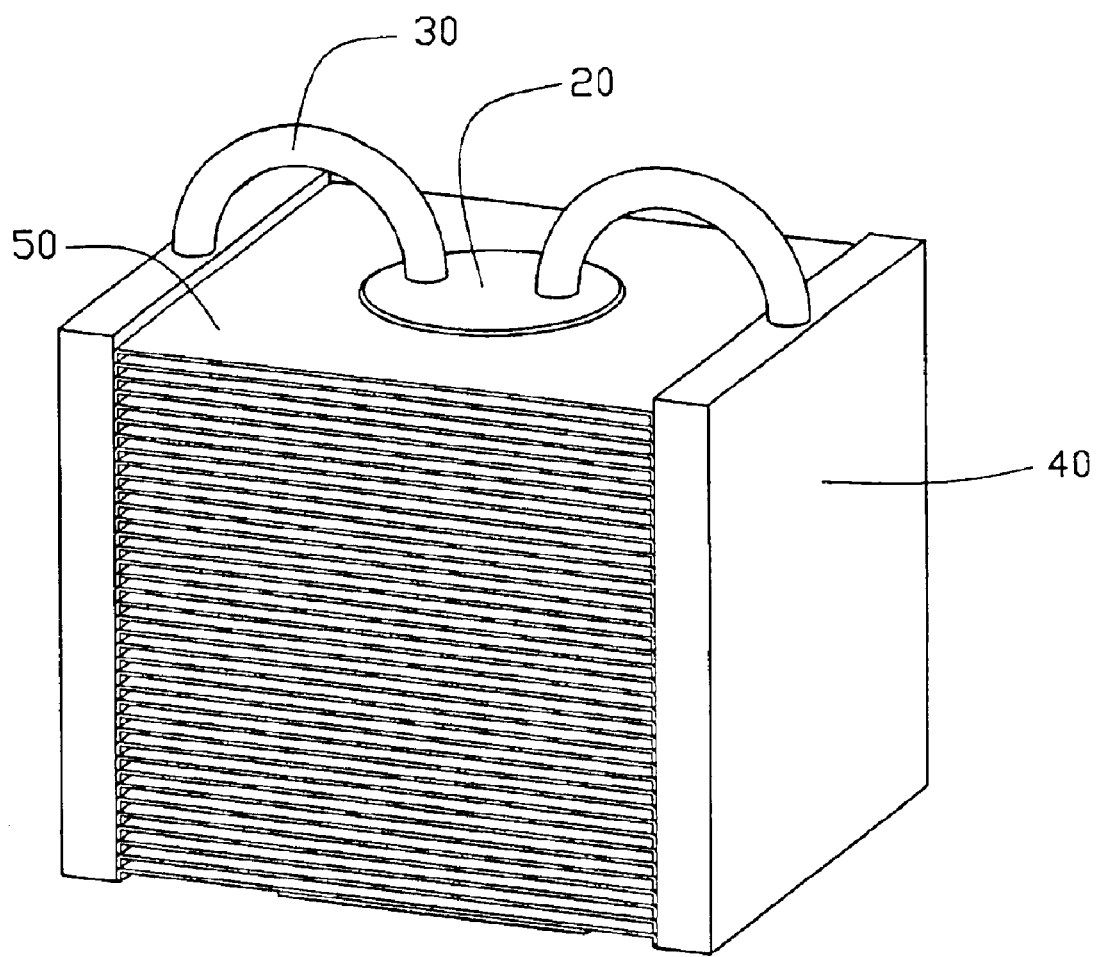
FIG. 1 is an isometric view of a heat dissipation device in accordance with the preferred embodiment of the present invention.
Figure 2:
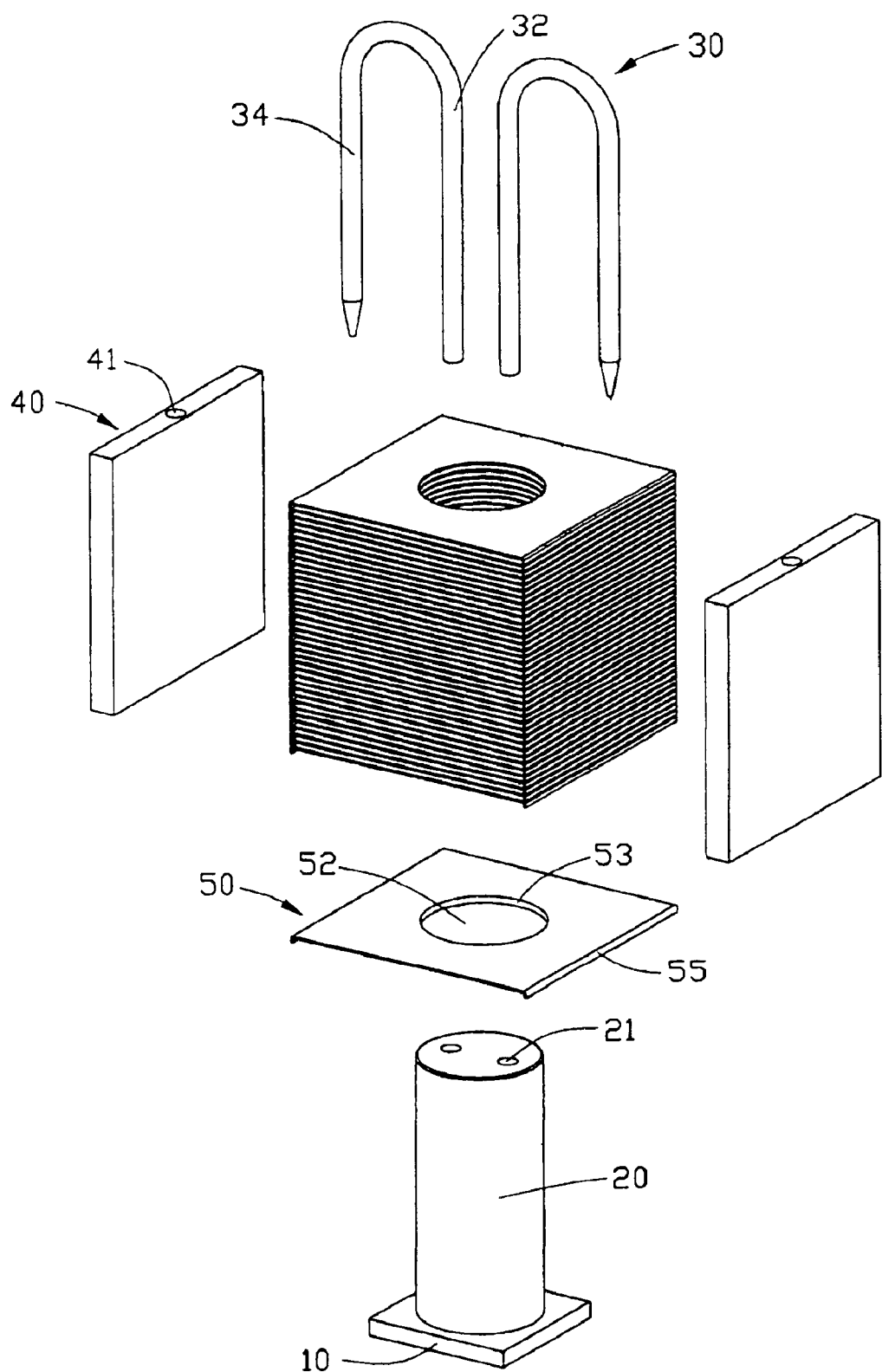
FIG. 2 is an exploded, isometric view of the heat dissipation device of FIG. 1.
Figure 3:
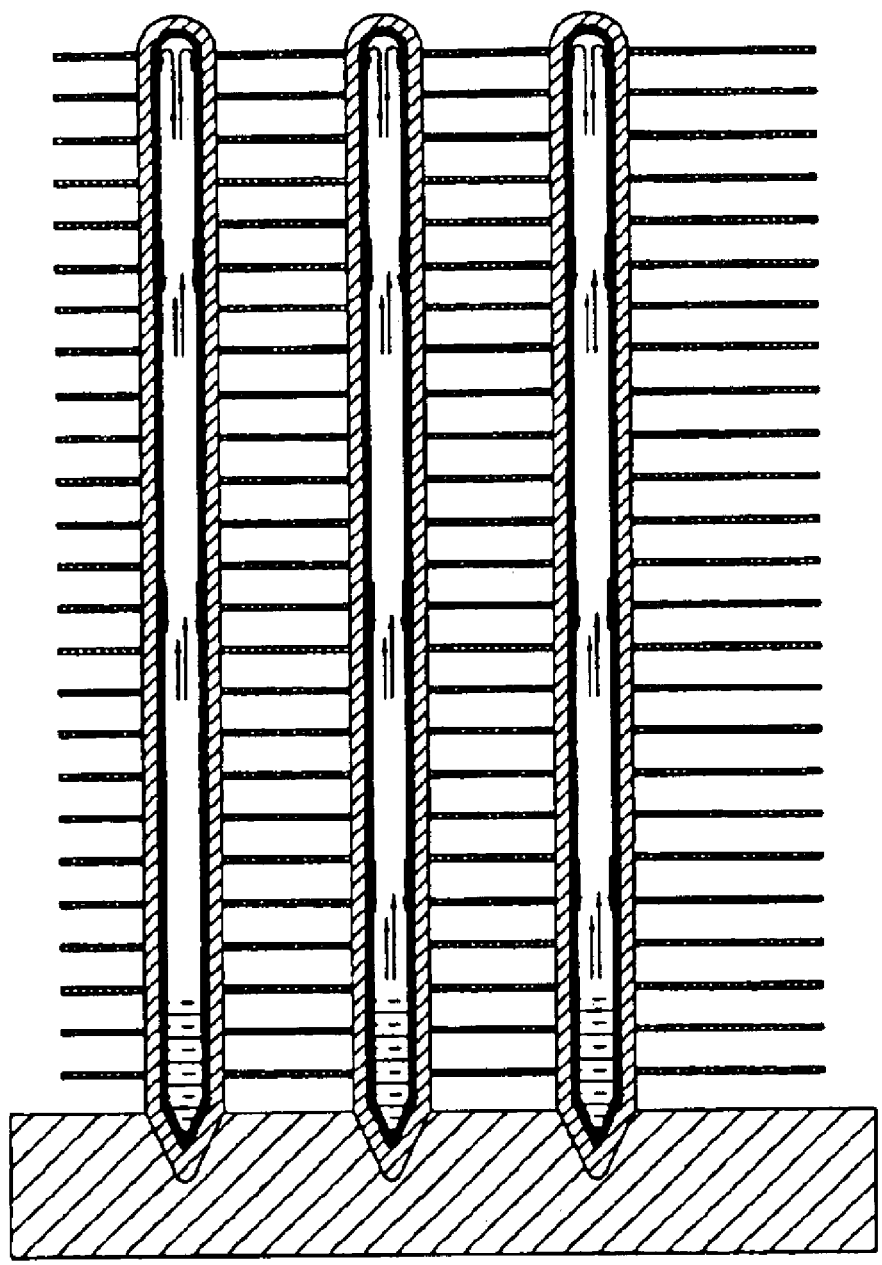
FIG. 3 is a cross sectional view of a conventional heat dissipation device.

Referring to FIGS. 1–2, a heat dissipation device in accordance with the preferred embodiment of the present invention comprises a flat base 10, a post 20, at least one heat pipe 30, at least one plate 40 and a plurality of fins 50.

In the proffered embodiment, the base 10 is flat and has a rectangular configuration. The base 10 comprises a bottom surface (not labeled) for abutting a surface of an electronic component, such as a central processing unit (CPU), and an opposite top surface 12.

The post 20 is cylindrical in the preferred embodiment. The post 20 extends perpendicularly from a middle of the top surface 12 of the base 10. A pair of through holes 21 is defined through the post 20 along a length direction of the post 20 in the preferred embodiment.

In the preferred embodiment, there are two heat pipes 30 and two plates 40. Each heat pipe 30 is substantially inverted U-shaped and comprises parallel first and second sections 32, 34. Each plate 40 is flat and rectangular configured. Each plate 40 defines an engaging hole 41 therein for receiving the second section 34 of a corresponding heat pipe 30.

Each fin 50 defines an aperture 52 in a middle thereof Combining portion 53 extends from a periphery of the aperture 52. A pair of flanges 55 extend from opposite peripheries of each fin 50. In the preferred embodiment, the combining portion 53 and the flanges 55 of each fin 50 are located at the same side of the fin 50.

In assembly of the heat dissipation device, the fins 50 are parallelly stacked on the base 10. The combining portions 53 cooperatively define a channel for receiving the heat pipes 30 and form a continuous wall for enhancing total engaging area with the post 20. The post 20 is thus received in said channel surrounded by the combining portions 53 of the fins 50, and soldered with solder such as tin to the combining portions 53. The plates 40 are soldered with solder such as tin, to the flanges 55 at opposite sides of the fins 50. The first sections 32 of the heat pipes 30 are soldered with solder such as tin into the through holes 21 and further contact the top surface 12 of the base 10. The second sections 34 of the heat pipes 30 are soldered with solder such as tin into the engaging holes 41 of the plates 40. Thus, the heat dissipation device is assembled together.

In use of the heat dissipation device, the heat accumulated on the base 10 is transferred to the post 20 and the first sections 32 of the heat pipes 30. Then there are heat-transfers between the post 20 and the fins 50 engaged with the post 20, and between the post 20 and the first sections 32 of the heat pipes 30. The heat accumulated on the first sections 32 of the heat pipes 30 is transferred to the second sections 34 of the heat pipes 30. Thus, heat on the second sections 34 of the heat pipes 30 is transferred to the plates 40, and further transferred from the plates 40 to the fins 50 engaged with the plates 40. The fins 50 finally dissipate heat thereon to ambient space.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a base;
   a fin assembly parallel to the base and defining a void therein;
   a post extending perpendicularly from the base and received in the void;
   a plate attached to a periphery of the fin assembly and parallel to the post, and
   a heat pipe comprising a first end section lodged in the post and an opposite second end section engaged with the plate.

2. The heat dissipation device of claim 1, wherein the heat dissipation device is assembled by means of soldering.

3. The heat dissipation device of claim 1, wherein the post defines a through hole along a length direction thereof, and the first end section of the heat pipe is soldered to the post in the through hole.

4. The heat dissipation device of claim 1, wherein the plate defines an engaging hole therein, and the second end section of the heat pipe is soldered to the plate in the engaging hole.

5. The heat dissipation device of claim 1, wherein the heat pipe is substantially inverted U-shaped, the first and second end sections of the heat pipe are parallel to each other.

6. The heat dissipation device of claim 1, wherein the fin assembly comprises a plurality of fins parallel to each other.

7. The heat dissipation device of claim 6, wherein each of the fins forms a combining portion extending perpendicularly therefrom, the combining portions cooperatively surround the void for enhancing engaging area between the fins and the heat pipe.

8. The heat dissipation device of claim 6, wherein each of the fins forms a peripheral flange, for enhancing engaging area between the fins and the plate.

9. The heat dissipation device of claim 1, wherein the first end section of the heat pipe is further engaged with the base.

10. A heat dissipation device comprising:
    a post;
    a fin assembly comprising a plurality of fins stacked along the post;
    a plate attached to a periphery of the fin assembly and spaced from the post, and
    a heat pipe comprising a first end section lodged in the post and an opposite second end section engaged with the plate.

11. The heat dissipation device of claim 10, further comprising a base attached below the post.

12. The heat dissipation device of claim 11, wherein the fins are parallel to each other and the base is parallel to the fins.

13. The heat dissipation device of claim 12, wherein each of the fins forms a combining portion extending perpendicularly therefrom, the combining portions cooperatively surround the void and contact the heat pipe.

14. The heat dissipation device of claim 13, wherein each of the fins further forms a peripheral flange extending perpendicularly therefrom and attached to the plate.

15. A heat sink dissipation device comprising:
    a fin combination including a plurality of fins spaced from one another;
    at least one plate attached to one side of said fin combination and contacting at least some of said fins;
    a post adapted to receive heat from a heat generating device and extending through said fin combination, said plurality of fins commonly contacting a full circumference of said post;
    at least one heat pipe thermally connected between the post and the plate.

* * * * *